United States Patent [19]

Engel et al.

[11] Patent Number: 4,881,003
[45] Date of Patent: Nov. 14, 1989

[54] METHOD AND DEVICE FOR REDUCING THE WATER CONTENT IN PIEZOELECTRIC GAPO4 CRYSTAL ELEMENTS AND SO PRODUCED CRYSTAL ELEMENTS

[75] Inventors: Günter Engel, Leitring; Peter W. Krempl, Graz/Ragnitz; Helmut List, Graz; Uwe Posch, Graz; Alfred Nitsch, Graz, all of Austria

[73] Assignee: Avl Gesellschaft für Verbrennungskraftmaschinen und Messtechnik m.b.H. Prof.Dr.Dr.h.c. Hans List, Graz, Austria

[21] Appl. No.: 269,794

[22] Filed: Nov. 10, 1988

[30] Foreign Application Priority Data

Nov. 11, 1987 [AT] Austria ................... 2983/87
Dec. 23, 1987 [AT] Austria ................... 3424/87

[51] Int. Cl.$^4$ ............................................. H01L 41/08
[52] U.S. Cl. ..................................................... 310/311

[58] Field of Search ................. 310/311, 360, 361; 156/600, 601, 621, 622, 623 R, 624; 29/25.35; 423/305

[56] References Cited

U.S. PATENT DOCUMENTS 3,717,562 2/1973 Schinke et al. ............ 310/360 X
3,755,671 8/1973 Lockwood ................. 310/360 X

FOREIGN PATENT DOCUMENTS 379831 3/1986 Austria.

*Primary Examiner*—Mark O. Budd
*Attorney, Agent, or Firm*—Watson, Cole, Grindle & Watson

[57] ABSTRACT

In order to reduce the water content in piezoelectric GaPO$_4$ crystal elements the proposal is put forward that each GaPO$_4$ crystal element should be cut in its entirety from one uniform growth zone of a GaPO$_4$ raw crystal bar and should not contain any zone boundaries, and that the piezoelectric GaPO$_4$ crystal elements should be treated with a dehydrating solution, until an infrared coefficient of $\alpha < 1.5$ cm$^{-1}$ is obtained at a wavelength in the vicinity of 2.0 μm.

15 Claims, 4 Drawing Sheets $$\Delta\alpha = \frac{1}{d}\log\frac{T_2}{T_1} \triangleq 39\,ppm\,H_2O$$

METHOD AND DEVICE FOR REDUCING THE WATER CONTENT IN PIEZOELECTRIC GAPO₄ CRYSTAL ELEMENTS AND SO PRODUCED CRYSTAL ELEMENTS

BACKGROUND OF THE INVENTION

This invention relates to a method of reducing the water content in piezoelectric GaPo₄ crystal elements, a device for implementing the method and crystal elements produced by the method.

DESCRIPTION OF THE PRIOR ART

Crystal elements, for instance those for use in transducers, are cut from the raw $GaPO_4$ crystal bar—usually leaving out the seed—and are then formed, ground and/or polished, cleaned and provided with electrodes and built into the respective housing.

Many of the properties of a transducer for example have so far been ascribed almost exclusively to the properties and design of the transducer housing or of the diaphragm subject to the quantity to be measured. In fact, however, transducers of identical designs and provided with indentical crystal elements are often characterized by differences in their insulating behavior, resistance to temperature shocks, maximum pressure load and linearity, in addition to small but measurable deviations in important properties such as elasticity and piezoelectric sensitivity.

In resonators too, undesirable properties are caused by different frequency constants for identical cutting angles, different temperature coefficients of resonance frequencies and irreversible ageing phenomena of the crystal elements.

A major criterion of quality for virtually all applications of piezoelectric crystal elements is the trace content of $H_2O$, which should be kept as low as possible. For quartz and $AlPO_4$ methods are known in which the $H_2O$ content is already checked during the growth process. The same applies to the growing of $GaPO_4$, where a high acid concentration is used on order to minimize the $H_2O$ content from the very beginning.

Another possibility of minimizing the $H_2O$ content is offered by the retrograde solubility of $H_2O$ in the case of $GaPO_4$ crystals, i.e., the solubility of $H_2O$ declines with a rise in temperature. The strategy of growing crystals at elevated temperatures resulting from this is limited by the corrosiveness of the growth solution, however. In the method described in Austrian Pat. No. 379 831 $H_2O$ trace values of approx. 50 ppm may be achieved at high acid concentrations under ideal conditions. Again, the influence of the growth rate on the $H_2O$ content must be taken into consideration, as water contents of up to 150 ppm are measured in fast-growing crystals.

Since higher growth rates at a low trace content of $H_2O$ should be aimed at, methods for the subsequent reduction of the $H_2O$ content must be applied.

This has mainly been achieved by heat treatment, possibly in a vacuum, utilizing the non-equilibrium state of $H_2O$ at crystal temperatures far above growing temperature. The non-equilibrium of $H_2O$ in the crystal lattice brought about in this manner may lead to damage in the crystal structure, however. For instance, so-called water bubbles may form, which will undo the quality improvement achieved by reduction of the $H_2O$ content.

In this context it has been suggested that the crystal elements be treated by electro-diffusion. Although it is possible to avoid the above disadvantages by means of this process, i.e., application of a high voltage and ionic diffusion induced thereby, it involves considerable effort and cost, as the tops of the electrode regions normal to the z-axis of the crystal elements must be cut off after the diffusion process, in order to remove the foreign ions accumulated in these regions.

SUMMARY OF THE INVENTION

It is the object of the present invention to propose a method by means of which homogeneous $GaPO_4$ crystal elements are obtained whose trace content of water can be minimized. In addition, the values of all important physical parameters, such as elasticity and piezoelectric sensitivity, should only have minimum variation.

In the invention this is achieved by cutting each $GaPO_4$ crystal element in its entirety from one uniform growth zone of a $GaPO_4$ raw crystal bar, leaving out any zone boundaries. Thus one way of solving the task of the invention is to avoid boundaries between the individual growth zones with an increased density of dislocation lines and a multitude of crystal defects, already during the cutting of the $GaPO_4$ crystal elements. In this way the higher water content of the raw crystal bar at the zone boundaries is of no consequence for the individual crystal elements free of any zone boundaries. Besides, the above crystal defects, especially in transducers with comparatively high thermal and mechanical loads on the crystal elements, often are starting points for fractures and cracks. Keeping the individual crystal elements of a measuring element free from zone boundaries will therefore lead to the improvements required above.

Another way of solving the task of the invention, using both $GaPO_4$ crystal elements that are cut so as to contain no zone boundaries and elements cut in any other fashion, provides that the piezoelectric $GaPO_4$ crystal elements be treated with a dehydrating solution until an infrared coefficient of $\alpha < 1.5$ cm$^{-1}$ is obtained at a wavelength of approx. 2.9 μm, with $$\alpha = 1/d \log (I_o/I)$$

$I_o$: intensity of primary radiation
$I$: intensity of transmission radiation
$d$: thickness of crystal element, the infrared coefficient ideally being $\alpha < 0.8$ cm$^{-1}$. With this method the water content may be expected to drop by an average of 5 to 20% within a period of 24 h. The physical parameters of the $GaPO_4$ crystal elements depending on the water content, such as resonance Q-factor, are improved, whereas other properties independent of the water content, will remain unaffected by this kind of non-aggressive treatment.

Since the vibrational Q of piezoelectric elements directly correlates with the $H_2O$ trace content, the method proposed by the invention has advantages for all resonator applications as well as for surface wave applications, since extremely low $H_2O$ values may be obtained, in particular in the active layer of the crystal platelets used for such purposes.

Due to the new method it has become possible to propose growth processes for $GaPO_4$ crystal elements employing low growing temperatures, as the argument for the necessity of higher temperatures, i.e., that of lower water inclusion, is now invalidated by the extraction process subsequent to the growing process.

In order to determine the water content of a crystalline sample from the infrared spectrum, it will suffice in the instance of a known intensity $I_o$ of the primary radiation and a known thickness d of the crystal element, to determine the transmission I at one point, for example at 2.9 μm approx. (corresponding to a wave number of 3,400 cm$^{-1}$ approx). For more accurate results an additional measurement may be taken at a reference wave number at which only absorption of the crystal lattice are effective, or a water-free crystal may be measured at a wave number of 3,400 cm$^{-1}$. Water-free crystals, i.e., crystals characterized by the disappearance of the water peak at 3,400 cm$^{-1}$, can be grown easily from deuterized growing solutions, a degree of deuteration of 99.7% being sufficient to permit the residual water content to be ignored. By means of deuteration the heavy water peak caused by the O-D oscillations is shifted into the range below 2,600 cm$^{-1}$ approximately, such that at 3,400 cm$^{-1}$ only absorptions of the crystal lattice will occur.

In a special embodiment of the invention the $GaPO_4$ crystal elements are immersed in a 4:1 to 1:4 mixture of Karl Fischer solution and absolute methanol (ratio by volume) after having been cut from the raw crystal bar. The piezoelectric crystal elements to be treated are immersed into a mixture of KF solution and absolute methanol—the methanol serving both as a solvent and as a reagent—, which mixture enters the reaction by forming a transition complex. The concentration of the KF solution should be chosen such that 1 ml solution corresponds to a water content of 2 to 5 mg.

In this instance the use of pyridine-free KF solution is recommended in order to avoid bad smells during the procedure.

The values obtained for the $H_2O$ content by means of the infrared spectrometer may be verified by titration according to Karl Fischer, for which purpose some of the crystal elements previously subject to infrared radiation must be weighed and pulverized in an environment characterized by a complete absence of atmospheric humidity. The pulverized samples are introduced into the titration cell again in a moisture-free environment. A suitable titrating agent is the pyridine-free KF reagent Merk 9258, for instance.

If the trace amounts of water are sufficiently small, coulometric titration may be used to advantage.

In a development of the method described by the invention the $GaPO_4$ crystal elements are immersed in a mixture of Karl Fischer solution and absolute methanol at a 1:1 ratio by volume, which mixture is then heated in a closed system free from atmospheric humidity. In the closed system, for example in a steel autoclave, the heating process causes a pressure buildup preventing the $SO_2$ dissolved in the KF solution from desorbing. In this way improved extraction values are obtained in less time. Boiling of the KF solution would induce the $SO_2$ dissolved in it to desorb and would quickly exhaust the extraction power of the solution.

In order to attain higher process temperatures, which ideally are close to the growing temperature of the crystal, it is provided in a variant of the invention that the mixture of Karl Fischer solution and absolute methanol be heated to 300° C. at a pressure of up to 20 bar.

Another variant of the invention proposes that the $GaPO_4$ crystal elements be immersed into an organic solvent in a reaction vessel, the solvent being immiscible with water but having a high affinity for water in the trace range. For this procedure an organic solvent is employed which will absorb only a limited amount of water but is characterized by a high affinity for water in the trace range.

In a further development of the method and the organic solvent is heated to boiling temperature in the reaction vessel, the ensuing mixture of solvent vapor and water vapor is cooled in a reflux condenser, and the water is removed from the solvent in an extractor located in front of the reaction vessel, preferably by means of a molecular sieve. For this purpose the crystals are immersed into the boiling solvent, whereupon a mixture of solvent and water will evaporate. This vapor is cooled in a reflux condenser and will not flow straight into the reaction vessel, but will first enter an extractor containing either extraction agents or a molecular sieve for water. There the water dissolved in the organic solvent is removed, and the pure solvent will return into the reaction vessel, starting the process from the beginning. In this manner a continuous operation of the system is made possible.

According to the invention an organic solvent from the group of toluene, benzene or xylene may be employed for this purpose.

The invention finally provides that the dehydrating solution remains in contact with the $GaPO_4$ crystal elements for a period of 12 hours to 60 days. For a process time of 20 days, for instance, a reduction of the $H_2O$ content by 90% is conceivable, which will satisfy even the most exacting demands in resonator applications. It should be mentioned in this context that resonator platelets usually are thinner than the crystal elements for other applications, which will render the method even more effective. In surface wave elements, too, the active layer determining acoustic attenuation is extremeley thin, permitting the required specifications to be met easily. Even in crystal elements whose water content is very low on account of the growing process used, the method specified by the invention will enable the $H_2O$ content to be reduced even further.

As both the solvent of the KF reagent (ethylene glycol monomethyl ether) and toluene, for instance, have very low flashpoints (12° C. and 6° C.) and low ignition and explosion temperatures, certain safety precautions have to be taken. Besides, inhaling of the vapors and skin contacts with the reaction liquid should be avoided.

According to the invention a preferable device is proposed for reducing the water content in piezoelectric $GaPO_4$ crystal elements, comprising a heatable reaction vessel for the $GaPO_4$ crystal elements, which is characterized in that the heatable reaction vessel contains an organic solvent and is connected to a reflux condenser, and that the outlet of the reflux condenser opens into an extractor (preferably a Soxhlet extractor) with a molecular sieve, and that the outlet of the extractor can be connected to the reaction vessel. Other suitable desiccating media such as $CaCl_2$ of $Na_2SO_4$ may be used in the extractor, of course. Into the reaction vessel heated in a silicone fluid bath the rod of a magnetic stirrer may be introduced.

The invention further provides that the assembly comprising the reaction vessel, the extractor and the reflux condenser be connected to a drying unit via a connecting valve, in order to keep the device free from atmospheric moisture.

A piezoelectric crystal element taken from a GaPO$_4$ crystal, with two opposite lateral faces for the application of electrodes, is thus characterized by the fact that each GaPO$_4$ crystal comes in its entirety from one and the same uniform growth zone of a GaPO$_4$ raw crystal bar and contains no zone boundaries. During the growth of synthetic GaPO$_4$ crystals typical growth zones will develop, marked M, Z, R, which will be discussed in more detail in the description of FIG. 1. R zones are characterized by the growth faces being rhombohedral. Such zones are made visible by heat treatment, irradiation with hard X-rays or X-ray topography.

A further development of the invention provides that the GaPO$_4$ crystal element is chosen from the growth zone Z or one of the R zones with their rhombohedral growth faces of a GaPO$_4$ raw crystal bar. Because of different growing conditions of the individual zones the R and Z zones are of major interest in GaPO$_4$ crystals, the Z zones usually being larger than the R zones because of their higher growth rate, which makes them preferable for the production of crystal elements.

DESCRIPTION OF THE DRAWINGS

Following is a more detailed description of the invention as illustrated by the attached drawings, in which

The raw crystal bar 1 of GaPO$_4$ which is shown schematically in FIG. 1, has a seed 2 in its center, from whose faces and edges the individual growth zones Z and R and the mantle zones M develop at different growth rates. The term "mantle zone M" is known from the description of quartz crystals and may also be used for GaPO$_4$ crystals. The term "R zones" stands for growth zones whose growth faces are rhombohedral; in crystallography, the term growth face does not reer to exterior geometrical shapes but to certain faces charcterized by Miller indices, and their symmetry equivalents. In the instance of R zones discussed here, these faces are described by the indices $\{h,0,l\}$ and $\{0,k,l\}$. The exterior geometrical shape of the boundary faces depends on the location of the zone as well as on the size of the crystal or the growth zone, and may be tetragonal or hexagonal, as shown in FIG. 2. FIG. 1 shows that the exterior faces of the Z zones are normal to the Z axis, while the exterior faces of the M zones are parallel thereto and those of the R zones inclined. The two crystal elements 3 presented in the growth zone Z are entirely cut from one zone and contain no zone boundaries therefore. The region 6 indicated by a broken line represents the cutting zone between crystal elements 3. The crystallographic axes of the crystal elements 3 are referred to as x, y, z. Since the zones with Z growth will grow considerably faster than those with R growth, it is easier to develop Z zones, which are therefore preferable, although R zones would be just as suitable for making measuring elements in transducers. At least two opposite lateral faces, 4, 5 of the crystal element 3 are ground and/or polished before the conductive electrodes (not shown here) are applied.

FIG. 2 gives a three-dimensional view of the raw crystal bar with a prismatic seed crystal 2. The mantle zones M are situated in the area of the x-y plane, the R zones between the Z zones and the mantle zones M.

Figure 1:
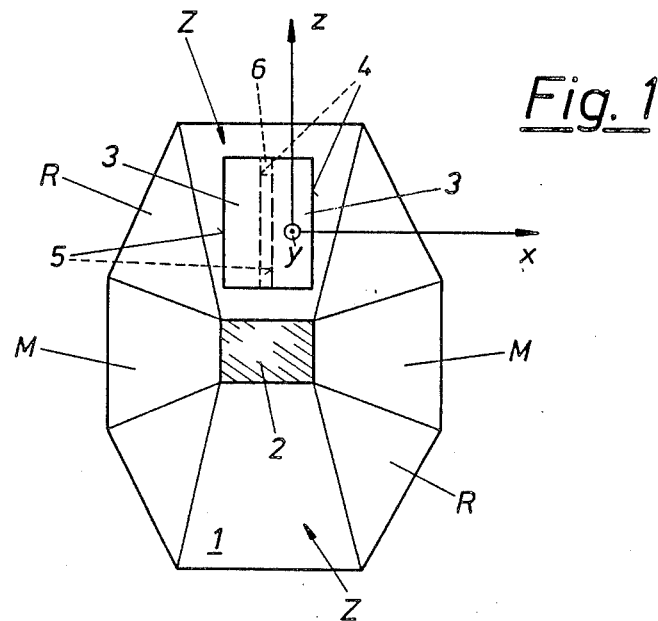
FIGS. 1 and 2 show the position of growth zones in a GaPO$_4$ raw crystal bar, with a GaPO$_4$ crystal element as described by the invention in FIG. 1.
Figure 2:
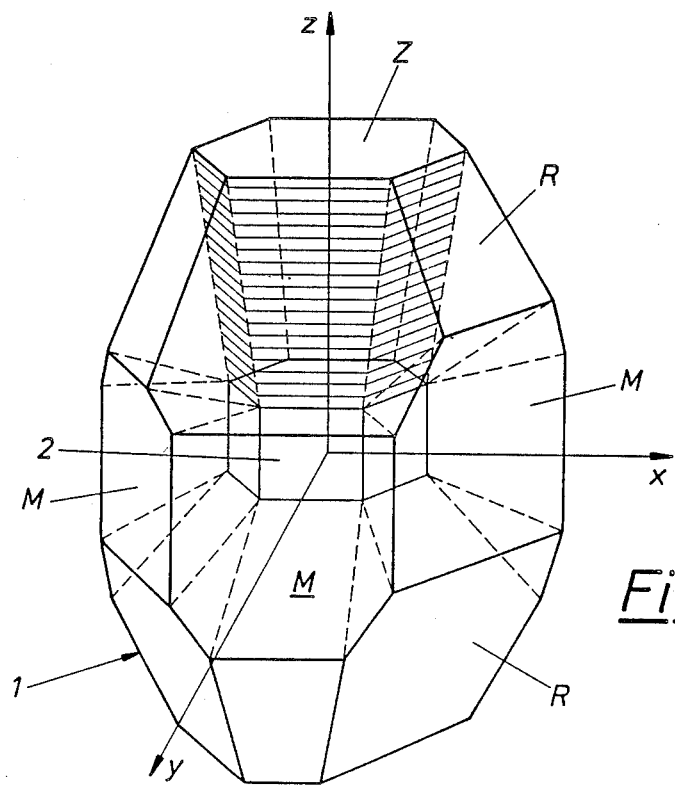
Figure 3:
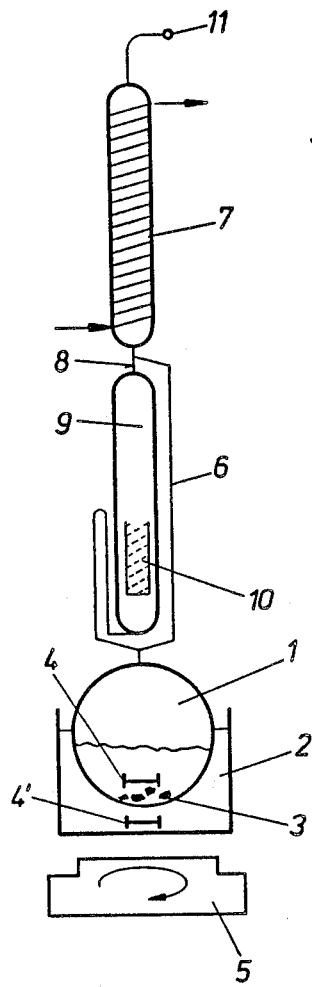
FIG. 3 shows a device implementation of the inventive method.

The device shown in FIG. 3 has a reaction vessel 1 heated in a heating bath 2 filed with silicone fluid. The reaction vessel 1, which is configured as a round-bottom flask, contains GaPO$_4$ crystal elemente 3 in toluene solvent. Both in the reaction vessel 1 and in the heating bath 2 there are stirring rods 4, 4' which are actuated by a magnetic stirrer 5. The solvent vapors arising from the boiling solvent, together with the water vapor from the crystal elements 3, enter the reflux condenser 7 through the tube 6; upon condensation they enter the Soxhlet extractor 9 via the outlet 8 of the reflux condenser. In the molecular sieve 10 the water is extracted from the solvent before the pure solvent flows back into the reaction vessel. By means of the connecting valve 11 the reflux condenser 7 and the extractor 9 connected thereto, as well as the reaction vessel 1 are connected to a drying unit not shown in this drawing, which will prevent the entrance of atmospheric moisture into the system.

In FIGS. 4 to 7 the values for transmission in percent are plotted along the ordinate, while the wave number in cm$^{-1}$ is plotted along the abscissa. The water content of the sample is indicated by the infrared transmission value in the vicinity of 3,400 cm$^{-1}$ (2.9 $\mu$m).

Figure 4:
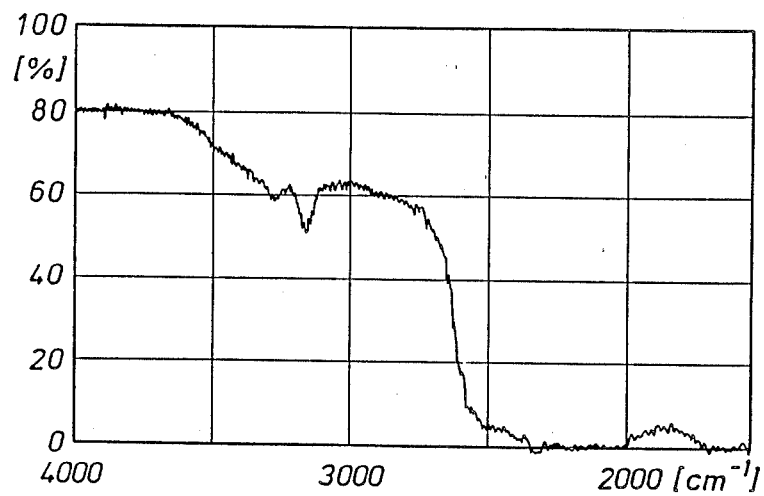

The spectrum in FIG. 4 shows that the infrared absorption of GaPO$_4$ crystal bars made in deuterized phosphoric acid ($\alpha = 0.66$ cm$^{-1}$) is surprisingly high even at wavelengths greater than 2.8 $\mu$m approx., which may be due to lattice absorptions in this wavelength range, since the crystal developed in deuterized phosphoric acid contains practically no water in the form of H$_2$O, which might otherwise be regarded as cause for the high absorption, and since the absorption of heavy water only sets in at wave numbers below 2,600 cm$^{-1}$ (as is clearly shown in FIG. 4). Empirical findings reveal that in GaPO$_4$ crystals an $\alpha < 1.5$ cm$^{-1}$ is a necessary condition if all further processing steps subsequent to the cutting of the crystal elements are to succeed without causing any damage while observing all conventional processing rules, and if the insulation values achieved in transducers are to be satisfactory and perfect functioning is to be ensured.

Figure 5:
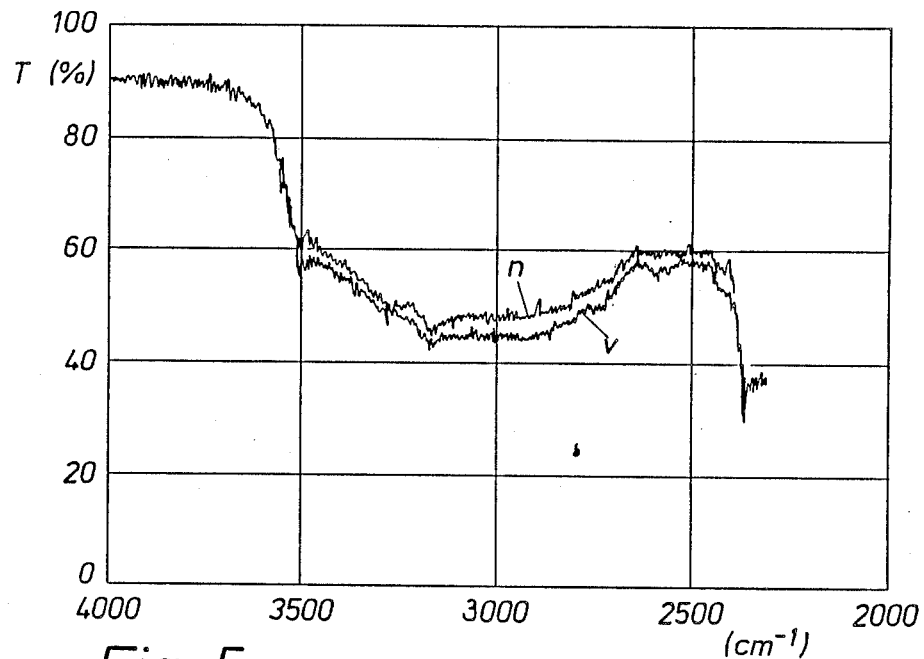
Figure 6:
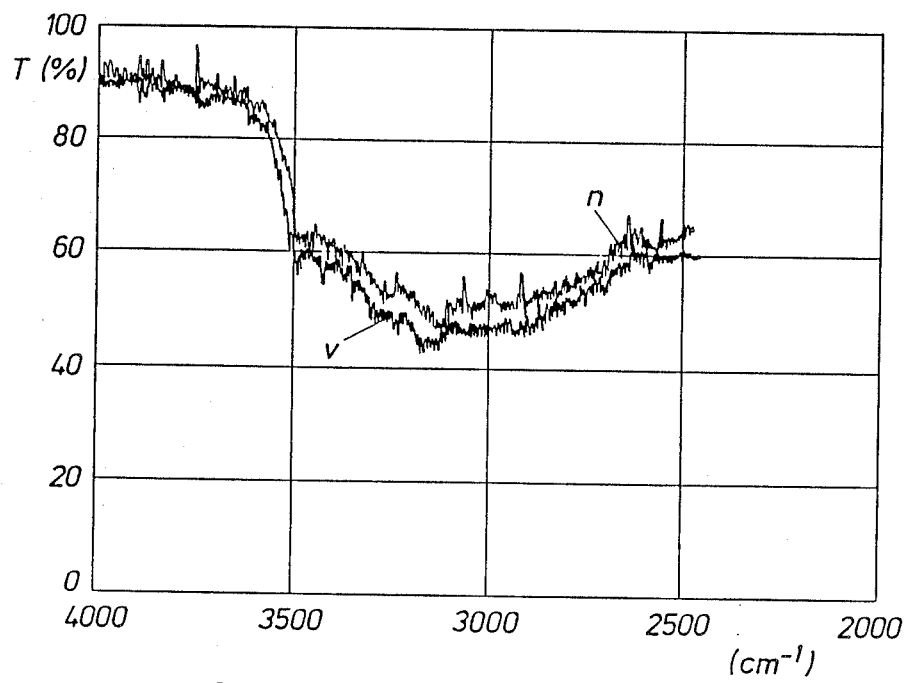

Some results of the extraction process according to the invention are shown in FIGS. 5 to 6, using infrared spectra of GaPO$_4$ crystal elements, in which the reduction of the H$_2$O content can be deduced from the diminished IR absorption in the hydroxyl band range. The curve measured before the extraction of H$_2$O is referred to as v and that representing the result as n.

In all instances the water content in the samples is markedly reduced, the extraction of H$_2$O in methanolic KF solution having been performed within a period of 24 hours (FIG. 5). Another possibility would be the use of toluene for the extraction process. The result of a 48 hours extraction process is presented in FIG. 6. To sum up it can be said that in the instance of GaPO$_4$ the water content is reduced by an average of 10% during an extraction period of 24 hours, as indicated by the systematic decrease of absorption in the hydroxyl range. A comparison of spectra differing by several extraction steps shows that the process remains effective over a prolonged period of time.

Figure 7:
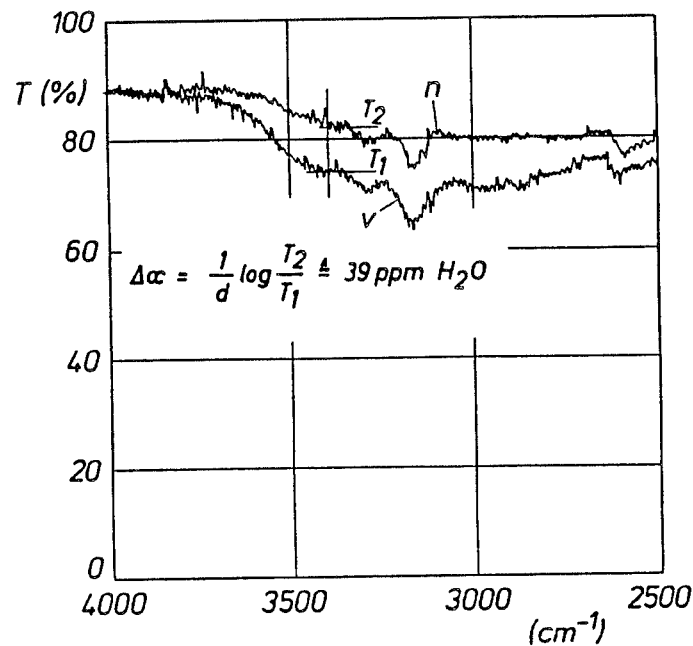
FIGS. 4 to 7 present infrared spectra of GaPO$_4$ crystal elements.

FIG. 7 gives a comparison of two spectra of a sample with a very low water content, subjected to several extractions over a period of two weeks.

The spectra of this sample have an absorption closely approaching the zero line of infrared absorption. For this reason determination of the absolute water content is no longer precise, whereas the difference in water contents before and after the extraction treatment can still be determined accurately. The water content of the sample in FIG. 7 is of the order of magnitude of 10 ppm.

The zero line is determined by measuring crystal elements grown from deuterized growing solutions (cf. FIG. 4), since in such instances there is no $H_2O$ absorption at 3,400 cm$^{-1}$.

The process of water extraction described here thus represents a promising method of diminishing the $H_2O$ trace content in $GaPO_4$ crystal elements.

We claim:

1. A method of reducing the water content in piezoelectric $GaPO_4$ crystal elements, wherein each of said piezoelectric $GaPO_4$ crystal elements is cut entirely from one uniform growth zone of a $GaPO_4$ raw crystal bar, and is free of any zone boundaries.

2. A method of reducing the water content in piezoelectric $GaPO_4$ crystal elements, wherein said piezoelectric $GaPO_4$ crystal elements are treated with a dehydrating solution until an infrared coefficient of $\alpha < 1.5$ cm$^{-1}$ is obtained at a wavelength of approximately 2.9 μm, with $$\alpha = 1/d \log (I_o/I)$$

$I_o$: intensity of primary radiation
$I$: intensity of transmission radiation
$d$: thickness of said crystal element.

3. A method according to claim 2, wherein said infrared coefficient $\alpha$ is less than 0.8 cm$^{-1}$.

4. A method according to claim 1, wherein said $GaPO_4$ crystal elements are immersed in a mixture of Karl Fischer solution and absolute methanol at a ratio by volume between 4:1 and 1:4 after having been cut from said raw crystal bar.

5. A method according to claim 2, wherein said $GaPO_4$ crystal elements are immersed in a mixture of Karl Fischer solution and absolute methanol at a ratio by volume between 4:1 and 1:4.

6. A method according to claim 4 or 5, wherein said $GaPO_4$ crystal elements are immersed in a mixture of Karl Fischer solution and absolute methanol at a 1:1 ratio by volume, wherein said mixture is then heated in a closed system free from atmospheric humidity.

7. A method according to claim 4 or 5, wherein said mixture of Karl Fischer solution and absolute methanol is heated to 300° C. at a pressure of up to 20 bar.

8. A method according to claim 1 and 2, wherein said $GaPO_4$ crystal elements are immersed into an organic solvent in a reaction vessel, said organic solvent being immiscible with water but having a high affinity for water in the trace range.

9. A method according to claim 8, wherein said organic solvent is heated to boiling temperature in said reaction vessel, and wherein an ensuing mixture of solvent vapor and water vapor is cooled in a reflux condenser, and wherein water is removed from said organic solvent in an extractor located in front of said reaction vessel.

10. A method according to claim 8, wherein said organic solvent is taken from a group consisting of toluene, benzene or xylene.

11. A method according to claim 2, wherein said dehydrating solution remains in contact with said $GaPO_4$ crystals over a period of 12 hours to 60 days.

12. A device for reducing the water content in piezoelectric $GaPO_4$ crystal elements, comprising a heatable reaction vessel for said $GaPO_4$ crytal elements, wherein said heatable reaction vessel contains an organic solvent and is connected to a reflux condenser, and wherein said reflux condenser is connected to an extractor with a molecular sieve, and wherein said extractor is connectable to said reaction vessel.

13. A device according to claim 12, wherein an assembly comprising said reaction vessel, said extractor and said reflux condenser is connectable to a drying unit by means of a connecting valve.

14. A piezoelectric crystal element with two opposite faces for the application of electrodes, which is made from a $GaPO_4$ crystal, wherein each of said $GaPO_4$ crystal elements comes entirely from one uniform growth zone of a $GaPO_4$ crystal bar and contans no zone boundaries.

15. A piezoelectric crystal element according to claim 14, wherein said $GaPO_4$ crystal element is chosen from the growth zone Z or one of the R zones having rhombohedral growth faces of said $GaPO_4$ raw crystal bar.

* * * * *